(12) United States Patent
Kim

(10) Patent No.: US 7,484,968 B2
(45) Date of Patent: Feb. 3, 2009

(54) SOCKET FOR AN ELECTRICAL TESTER

(75) Inventor: Woo-Seop Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 17 days.

(21) Appl. No.: 11/656,598

(22) Filed: Jan. 23, 2007

(65) Prior Publication Data
US 2007/0173097 A1  Jul. 26, 2007

(30) Foreign Application Priority Data
Jan. 25, 2006  (KR) ............... 10-2006-0007515

(51) Int. Cl.
H01R 12/00 (2006.01)

(52) U.S. Cl. .................................. 439/70; 324/158

(58) Field of Classification Search ............. 439/70–71; 324/158
See application file for complete search history.

(56) References Cited

U.S. PATENT DOCUMENTS 4,912,400 A * 3/1990 Plante .................... 324/754

FOREIGN PATENT DOCUMENTS

JP       2002-214286     7/2002
KR    20010087642 A     9/2001
KR    20020064060 A     8/2002

* cited by examiner

Primary Examiner—Truc T Nguyen
(74) Attorney, Agent, or Firm—Mills & Onello, LLP

(57) ABSTRACT

A socket for an electrical tester is disclosed. The socket includes a first contact board being arranged at a bottom side of a test object, and a second contact board being arranged at a top side of the test object. The first contact board includes a first contact member and a first conductive connection member, wherein the first contact member is electrically connected to a bottom connection terminal formed on the bottom side of the test object, and the first conductive connection member is isolated from the test object. The second contact board includes a second contact member, wherein the second contact member is electrically connected to the first conductive connection member and a top connection terminal formed on a top side of the test object, respectively. Therefore, the socket can have a simple configuration for providing the test current.

18 Claims, 4 Drawing Sheets

SOCKET FOR AN ELECTRICAL TESTER

CROSS-REFERENCE TO RELATED APPLICATIONS

This application claims priority under 35 USC § 119 to Korean Patent Application No. 10-2006-0007515 filed on Jan. 25, 2006 in the Korean Intellectual Property Office, the contents of which are herein incorporated by reference in their entirety.

BACKGROUND OF THE INVENTION

1. Field of the Invention

The present invention relates to a socket for an electrical tester, and more particularly to a socket used in testing electrical properties of a semiconductor package.

2. Description of the Related Art

Generally, a plurality of semiconductor chips is formed on a semiconductor board by performing various semiconductor processes. In order to install the formed semiconductor chips on a motherboard, a packaging process is performed on the semiconductor board.

According to a conventional packaging process, the semiconductor board is cut along a scribe lane to separate the semiconductor board into respective semiconductor chips. After the semiconductor chip is attached on a circuit board, a bonding pad of the semiconductor chip is electrically coupled to the circuit board by using a conductive wire, etc. Then, a mold is formed on the circuit board so that the semiconductor chip is surrounded by a mold. An external connecting terminal, such as a solder ball, is mounted on the circuit board.

An electrical property test is performed on a semiconductor package completed by the above processes. A tester used in the electrical property test includes a tester head for providing a test current to the semiconductor package, and a socket that transmits the test current to the semiconductor package, so that the tester head is electrically coupled to the semiconductor package.

However, a conventional socket has a configuration in which the socket can be electrically contacted only to a connecting terminal formed on one side of the semiconductor package. Thus, to test electrical properties of the bonding pad formed on both sides of the semiconductor package and a dual-side connecting terminal, such as a solder ball, after performing a test process on one side of the semiconductor package, the semiconductor package has to be turned over to perform a test process on the other side of the semiconductor package.

In order to obviate the above problem, a prior art socket capable of performing the electrical property test of the bonding pad and solder ball that are formed on both sides of the semiconductor package can be provided, as is disclosed in Korean Patent Laid-Open Publication No. 2001-87642.

The socket disclosed in Korean Patent Laid-Open Publication No. 2001-87642 includes a socket body and a socket lid. A first connecting pin that is electrically connected with a connecting terminal formed on a bottom side of the semiconductor package is implemented in the socket body. A second connecting pin that is electrically connected with a connecting terminal formed on a top side of the semiconductor package is implemented in the socket lid. Thus, the connecting terminals formed on both sides of the semiconductor package can be tested at one time using the first and second connecting pins.

However, the first and second connecting pins are not electrically connected in the conventional socket. Therefore, an additional test current needs to be provided to the respective first and second connecting pins from the tester head. Thus, there is a problem in that the conventional socket has a very complicated configuration for providing the test current.

Particularly, in the prior art socket, the electrical property test can be performed only on the connecting terminals formed on both sides of the semiconductor package. Therefore, in a case where a stack package including at least two laminated semiconductor packages is tested, the conventional socket can not perform the electrical property test on the laminated semiconductor packages.

SUMMARY OF THE INVENTION

In accordance with aspects of the present invention, provided is a socket for an electrical tester having a simple configuration for providing a test current.

In accordance with another aspect of the present invention, also provided is a socket capable of performing an electrical property test on laminated semiconductor packages.

In accordance with another aspect of the present invention, a socket for an electrical tester includes a first contact board and a second contact board. The first contact board is arranged at a bottom side of a test object and includes a first contact member and a first conductive connection member, wherein the first contact member is electrically connected to a bottom connection terminal formed on the bottom side of the test object, and the first conductive connection member is isolated from the test object. The second contact board is arranged at a top side of the test object and includes a second contact member, wherein the second contact member is electrically connected to the first conductive connection member and a top connection terminal formed on a top side of the test object.

The first contact member can include a pogo pin elastically contacting with the bottom connection terminal.

The second contact member can comprise a connection pin formed on the second contact board and electrically connected to the first conductive connection member; a conductive pattern extended from the connection pin; and a contact pin formed on the second contact board, extended from the conductive pattern, and electrically connected to the top connection terminal.

The second contact board can include an opening part configured to expose the top side of the test object.

The socket can further comprise a connection structure connecting the first contact board to the second contact board.

The test object can include a semiconductor package having a conductive ball corresponding to the bottom connection terminal and a bonding pad corresponding to the top connection terminal.

The test object can comprise a stack package including a plurality of laminated semiconductor packages, the stack package having a conductive ball corresponding to the bottom connection terminal and a bonding pad corresponding to the top connection terminal.

The socket can further comprise a third contact board interposed between the semiconductor packages and including a third contact member, the third contact member being electrically connected to the conductive ball and the bonding pad.

The third contact board can further include a second conductive connection member configured to electrically connect the first conductive connection member to the second contact member.

The socket can further comprise a socket body in which the first contact board is installed; and a socket lid connected to the socket body, the socket lid being configured to rotate with respect to the socket body to press the second contact board in a direction of the test object.

In accordance with aspect another of the present invention, a socket for an electrical tester includes a first contact board, a second contact board, a third contact board and a connection structure. The first contact board is arranged at a bottom side of a stack package and includes a first contact member and a first conductive connection member, wherein the stack package includes a first semiconductor package and a second semiconductor package having a conductive ball and a bonding pad, and wherein the first contact member is electrically connected to the conductive ball of the first semiconductor package and the first conductive connection member is isolated from the stack package. The second contact board is arranged at a top side of the second semiconductor package and includes a second contact member, wherein the second contact member is electrically connected to the first conductive connection member and the bonding pad of the second semiconductor package. The third contact board is interposed between the first and second semiconductor packages and includes a third contact member that is electrically connected to the conductive ball of the second semiconductor package and the bonding pad of the first semiconductor package. The connection structure connects the first through third contact boards to each other.

The second contact member can comprise a connection pin formed on the second contact board and electrically connected to the first conductive connection member; a conductive pattern extended from the connection pin; and a contact pin formed on the second contact board, extended from the conductive pattern, and electrically connected to the bonding pad of the second semiconductor package.

The third contact board can further include a second conductive connection member electrically connecting the first conductive connection member to the second contact member.

The socket can further comprise a socket body in which the first contact board is installed; and a socket lid connected to the socket body, the socket lid being configured to rotate with respect to the socket body to press the second contact board in a direction of the stack package.

In accordance with anther aspect of the invention, provided is a socket for an electrical tester comprising: a first contact board arranged at a bottom side of a test object and including a first contact member and a first conductive connection member, the first contact member being electrically connected to a bottom connection terminal formed on the bottom side of the test object, the first conductive connection member being isolated from the test object; a second contact board arranged at a top side of the test object and including a second contact member, the second contact member being electrically connected to the first conductive connection member and a top connection terminal formed on a top side of the test object; a socket body in which the first contact board is installed; and a socket lid connected to the socket body, the socket lid being configured to rotate with respect to the socket body to press the second contact board in a direction of the test object, wherein the test object includes a semiconductor package having a conductive ball corresponding to the bottom connection terminal and a bonding pad corresponding to the top connection terminal.

The second contact member can comprise a connection pin formed on the second contact board and electrically connected to the first conductive connection member; a conductive pattern extended from the connection pin; and a contact pin formed on the second contact board, extended from the conductive pattern, and electrically connected to the top connection terminal.

The semiconductor package can be a stack package including a plurality of laminated semiconductor packages, the stack package having a conductive ball corresponding to the bottom connection terminal and a bonding pad corresponding to the top connection terminal.

In such a case, the socket can further comprise a third contact board interposed between the semiconductor packages and including a third contact member, the third contact member being electrically connected to the conductive ball and the bonding pad.

As a result, the socket can have a simple configuration for providing the test current. Particularly, since the third contact member is interposed between the stacked semiconductor packages, an electrical property test on the laminated semiconductor packages can also be performed.

BRIEF DESCRIPTION OF THE DRAWINGS

The aspects of the present invention will become readily apparent by reference to the following detailed description when considered in conjunction with the accompanying drawings wherein.

DESCRIPTION OF THE EMBODIMENTS

Figure 1:
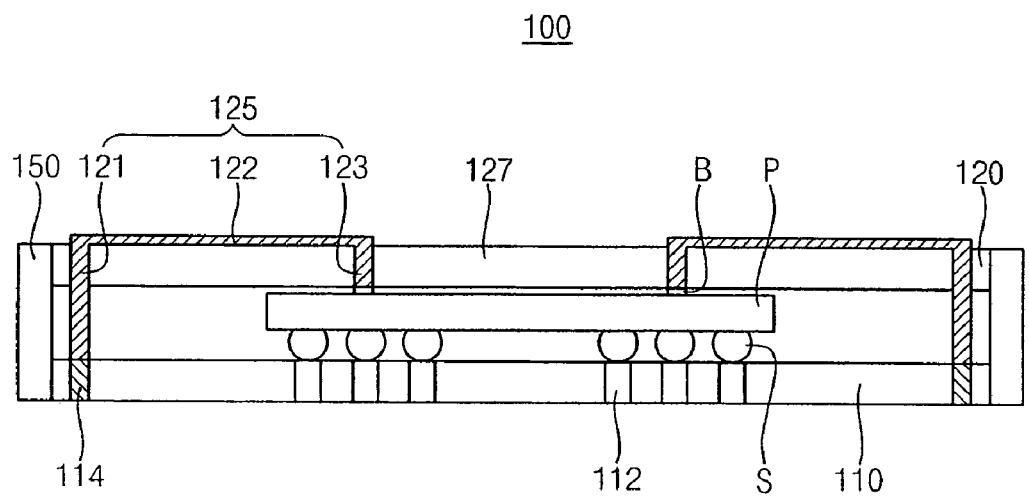
FIG. 1 is a cross-sectional view illustrating an example embodiment of a socket for an electrical tester according to an aspect of the present invention.

Aspects of the present invention now will be described more fully with reference to the accompanying drawings, in which example embodiments of the invention are shown. This invention can, however, be embodied in many different forms and should not be construed as limited to the embodiments set forth herein. Like reference numerals refer to like elements throughout this application.

It will be understood that, although the terms first, second, etc. can be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or directly connected or coupled to the other element or intervening elements can be present. In contrast, when an element is referred to as being "directly on: or "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

FIG. 1 is a cross-sectional view illustrating an example embodiment of a socket for an electrical tester according to an aspect of the present invention.

Referring to FIG. 1, for example, a semiconductor package P can be a test object of an electrical property test. A bonding pad B corresponding to a top connecting terminal is formed on a top side of the semiconductor package P, and a conductive ball S, such as a solder ball corresponding to a bottom connecting terminal, is mounted on a bottom side of the semiconductor package P. The bonding pad B and conductive ball S are electrically connected.

A socket 100 for the electrical property test on the semiconductor package P includes a first contact board 110, a second contact board 120 and a connection structure 150.

Figure 2:
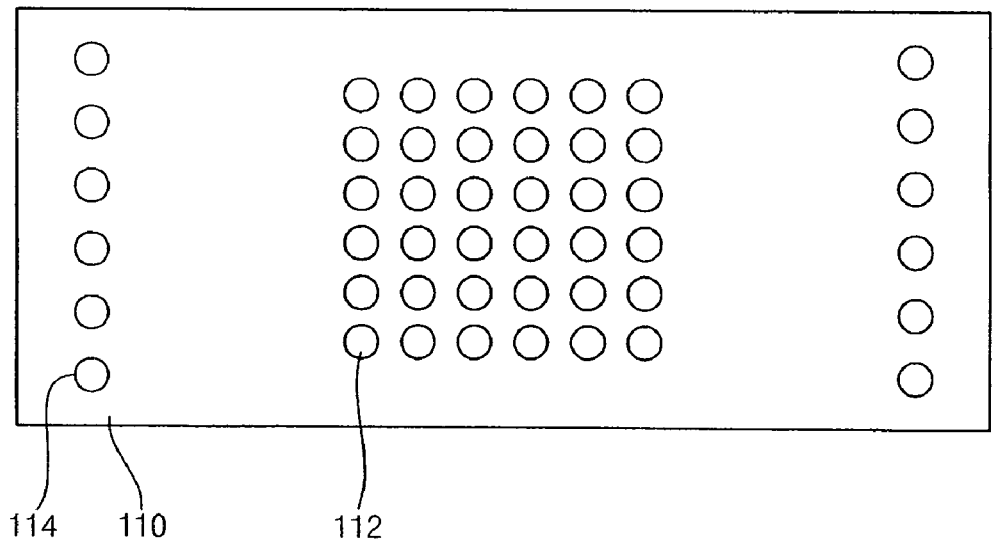
FIG. 2 is a plan view illustrating an example embodiment of the first contact board in FIG. 1.

FIG. 2 is a plan view illustrating the first contact board 110 in FIG. 1.

Referring to FIG. 1 and FIG. 2, the first contact board 110 is made of an insulating material having a shape of a flat board, in this embodiment. The first contact board 110 is contacted with the bottom side of the semiconductor package P. A first contact member 112 electrically contacting the conductive ball S is arranged in a central part of the first contact board 110. Thus, the first contact member 112 has substantially the same arrangement configuration as that of the conductive ball S. For example, a pogo pin elastically contacting with the conductive ball S can be adapted as the first contact member 1 12.

In addition, the first contact board 110 includes a first conductive connection member 114. The first conductive connection member 114 is arranged at both edges of the first contact board 110, thereby being isolated from the semiconductor package P. The first conductive connection member 114 can be formed by filling a conductive material, such as metal, in a through hole formed on the first contact board 110.

The first contact member 112 and first conductive connection member 114 respectively receive a test current used in the electrical property test on the semiconductor package from a tester head (not illustrated) of an electrical tester. Namely, according to the example embodiment of the present invention, the test current is provided only to the first contact board 110, thereby also being provided to the second contact board 120. Therefore, a circuit configuration for providing the test current can be much simpler.

Herein, the first contact member 112 and first conductive connection member 114 can be arranged with an opposite configuration to the above arrangement configuration. Namely, when the conductive ball S is mounted on the edge of the bottom side of the semiconductor package P, the first contact member 112 can be arranged at the edge of the first contact board 110, and the first conductive connection member 114 can be arranged in the central part of the first contact board 110. However, the first conductive connection member 114 needs to be isolated from the semiconductor package P.

Figure 3:
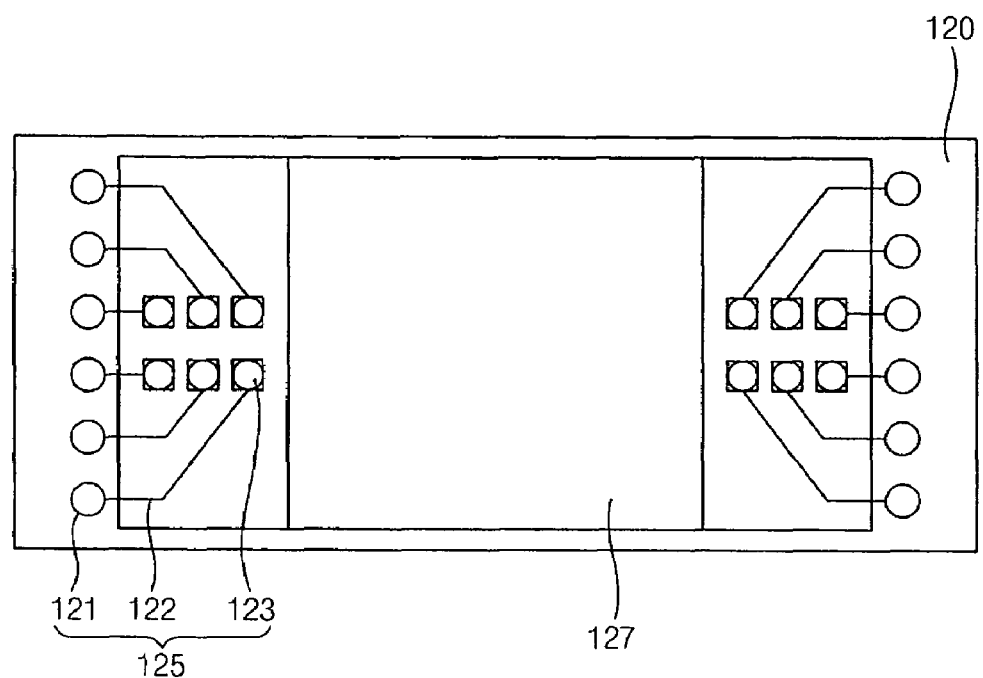
FIG. 3 is a plan view illustrating an example embodiment of the second contact board in FIG. 1.

FIG. 3 is a plan view illustrating the second contact board 120 in FIG. 1.

Referring to FIG. 1 and FIG. 3, in this embodiment the second contact board 120 is also made of an insulating material having a shape of a flat board, such as the first contact board 110. The second contact board 120 includes a second contact member 125 configured to electrically contact the bonding pad B.

The second contact member 125 includes a connection pin 121, a contact pin 123 and a conductive pattern 122. The connection pin 121 is inserted in a through hole formed on an edge of the second contact board 120, thereby being configured to electrically connect with the first conductive connection member 114. The contact pin 123 is inserted in a through hole formed on a central part of the second contact board 120, thereby being configured to electrically contact the bonding pad B. The conductive pattern 122 is formed on the second contact board 120, thereby connecting the connection pin 121 and the contact pin 123. The second contact member 125 can be formed through a process of forming a conductive film (not illustrated) on the second contact board 120 so as to fill the through holes and patterning the conductive film. Particularly, so as to improve reliability of the electrical property test, the conductive patterns 122 are preferably substantially identical and configured to have a minimal distance from each other.

In addition, to effectively transfer excess heat away from the semiconductor package P, an opening part 127 exposing the top side of the semiconductor package P is formed in a central part of the second contact member 125.

Referring to FIG. 1, the first and second contact boards 110 and 120 are connected on an inside wall of the connection structure 150. In various embodiments, the first and second contact boards 110 and 120 can be integrated into a single structure with the connection structure 150, or a structure separable from the connection structure 150. However, in order to facilitate repair or replacement of the first and second contact boards 110 and 120, the first and second contact boards 110 and 120 are preferred to be connected so as to be separable from the connection structure 150. Additionally, in various embodiments, the first and second contact boards 110 and 120 can also be used in a separated configuration, without using the connection structure 150.

Figure 4:
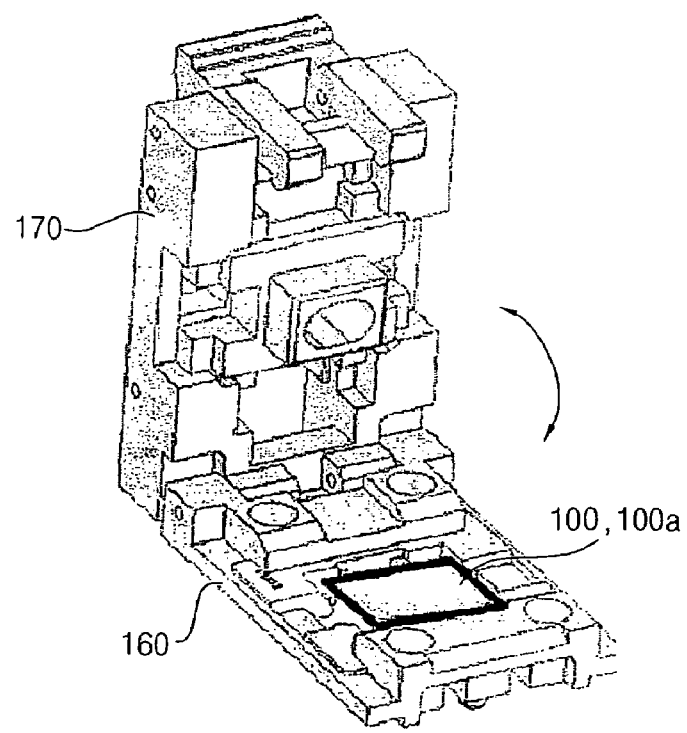
FIGS. 4 and 5 are perspective views illustrating example embodiments of a socket body and a socket lid holding the first and second contact boards in FIG. 1.
Figure 5:
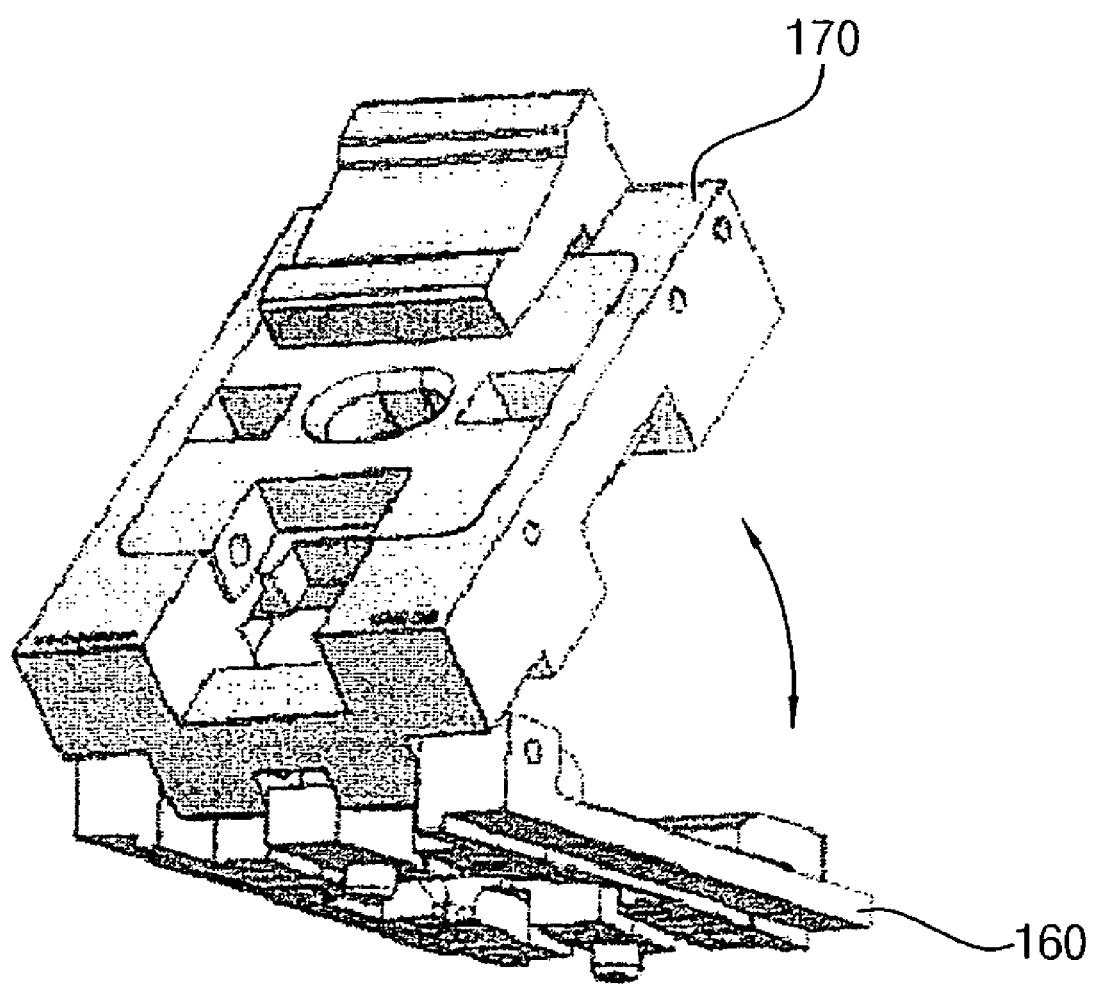

FIGS. 4 and 5 are perspective views illustrating a socket body and a socket lid configured for holding the first and second contact boards 110 and 120 in FIG. 1.

The first and second contact boards 110 and 120 and the connection structure 150 are arranged on the socket body 160. The socket lid 170 is connected to the socket body 160 so as to rotate with respect thereto, thereby pressing the second contact board 120 to a direction of the semiconductor package P, so as to accurately contact the second contact member 125, and more specifically, to accurately contact the contact pin 123 to the bonding pad B.

According to the example embodiment of the present invention, the second contact member 125 of the second contact board 120 is electrically connected with the first conductive connection member 114 of the first contact board 110. Therefore, the test current can be provided only to the first contact board 110 and does not need to be provided to the second contact board 120. As a result, a very simple circuit configuration for providing the test current can be achieved.

Figure 6:
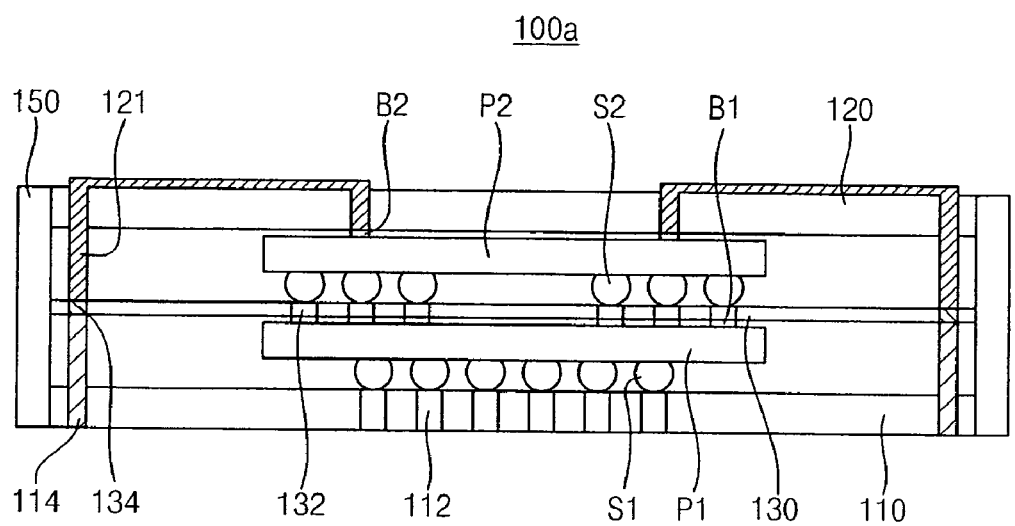
FIG. 6 is a cross-sectional view illustrating another example embodiment of a socket for an electrical tester according to another aspect of the present invention.

FIG. 6 is a cross-sectional view illustrating another example embodiment of a socket 100a for an electrical tester according to another aspect of the present invention.

The socket 100a is used for an electrical property test on a stack package including the laminated semiconductor packages of FIG. 1. The socket 100a according to the example embodiment includes substantially the same elements as those of the socket 100 in FIG. 1, except for further including a third contact board 130. Thus, the identical elements are presented with identical reference numbers, and additional explanation about the identical elements will be omitted.

Figure 7:
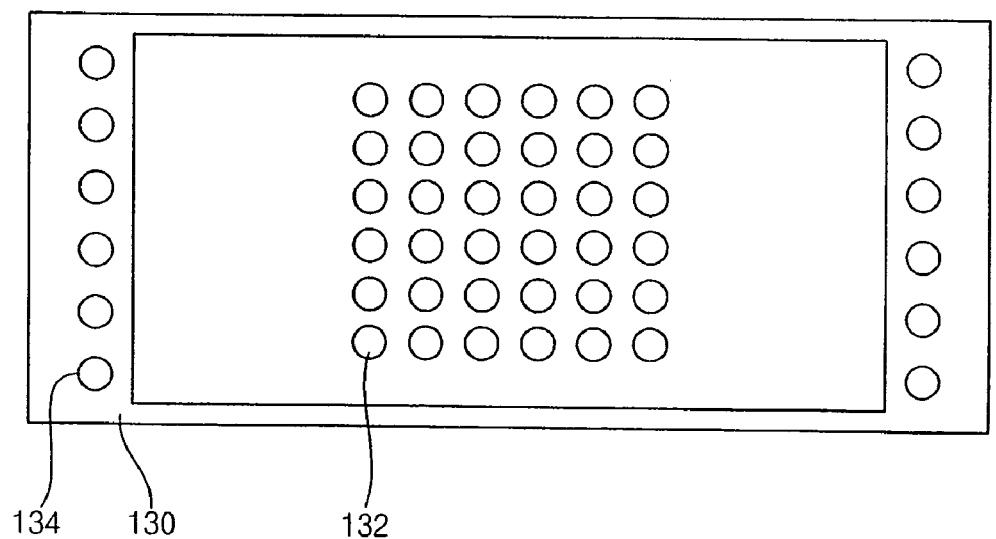
FIG. 7 is a plan view illustrating an example embodiment of the third contact board in FIG. 6.

FIG. 7 is a plan view illustrating the third contact board 130 in FIG. 6.

Referring to FIG. 6 and FIG. 7, the socket 100a includes a first contact board 110, a second contact board 120, a third contact board 130 and a connection structure 150.

The stack package that is a test object includes a first package P1 and a second package P2 that is laminated on the first package P1. Since the first and second packages P1 and P2 include substantially the same elements as the package P in FIG. 1, additional explanation will be omitted.

The third contact board 130 has a substantially similar size and shape to those of the first and second contact boards 110 and 120. The third contact board 130 is arranged between the first and second contact boards 110 and 120. The third contact board 130 can be integrated into a single structure with the connection structure 150, or a structure separable from the connection structure 150, in substantially the same manner as the first and second contact boards 110 and 120.

The third contact board 130 is interposed between the first package P1 and the second package P2. Therefore, a bonding pad B1 of the first package P1 and a conductive ball S2 of the second package P2 are not connected, despite contacting with each other. The third contact board 130 is interposed between the first package P1 and the second package P2, thereby contacting with the bonding pad B1 of the first package P1 and the conductive ball S2 of the second package P2.

In order to electrically connect the bonding pad B1 of the first package P1 and the conductive ball S2 of the second package P2 through the third contact board 130, a third contact member 132 is arranged in a central part of the third contact board 130. More specifically, the third contact member 132 is formed in a through hole formed on the central part of the third contact board 130. A position and an arrangement of the third contact member 132 can be changed according to the bonding pad B1 of the first package P1 and the conductive ball S2 of the second package P2.

In addition, a second conductive connection member 134 is arranged at both edges of the third contact board 130. The second conductive connection member 134 is configured to electrically connect a first conductive connection member 114 of the first contact board 110 and a connection pin 121 of the second contact board 120. Thus, the second conductive connection member 134 is also formed through a side of the stack package, similar to the first conductive connection member 114 in FIG. 1.

According to the example embodiment of the present invention, not only is there provided an electrical contact between the highest layer and the lowest layer of the stack package, but also an electrical contact between the first and second packages P1 and P2 can be checked by using the third contact board 130.

As described above, according to the example embodiments of the present invention, since the second contact member of the second contact board is electrically connected to the first conductive connection member of the first contact board, although the test current is provided only to the first contact board, the test current can be provided to both of the first and second contact members. Therefore, the socket can have a simple configuration for providing the test current.

Particularly, since the third contact member is interposed between the stacked semiconductor packages, the electrical property test on the laminated semiconductor packages can also be performed.

Having thus described example embodiments, it is to be understood that the present invention is defined by the appended claims, and is not to be limited by particular details set forth in the above description and embodiments, as many apparent variations thereof are possible without departing from the spirit or scope thereof as hereinafter claimed. It will also be understood that the invention may be implemented in various forms and embodiments, and that they may be applied in numerous applications, only some of which have been described herein. It is intended by the following claims to claim that which is literally described and all equivalents thereto, including all modifications and variations that fall within the scope of each claim.

What is claimed is:

1. A socket for an electrical tester comprising:
    a first contact board arranged at a bottom side of a test object and including a first contact member and a first conductive connection member, the first contact member being electrically connected to a bottom connection terminal formed on the bottom side of the test object, the first conductive connection member being isolated from the test object; and
    a second contact board arranged at a top side of the test object and including a second contact member, the second contact member being electrically connected to the first conductive connection member and a top connection terminal formed on a top side of the test object.

2. The socket of claim 1, wherein the first contact member includes a pogo pin elastically contacting the bottom connection terminal.

3. The socket of claim 1, wherein the second contact member comprises:
    a connection pin formed on the second contact board and electrically connected to the first conductive connection member;
    a conductive pattern extended from the connection pin; and
    a contact pin formed on the second contact board, extended from the conductive pattern, and electrically connected to the top connection terminal.

4. The socket of claim 1, wherein the second contact board includes an opening part configured to expose the top side of the test object.

5. The socket of claim 1, further comprising a connection structure connecting the first contact board to the second contact board.

6. The socket of claim 1, wherein the test object includes a semiconductor package having a conductive ball corresponding to the bottom connection terminal and a bonding pad corresponding to the top connection terminal.

7. The socket of claim 1, wherein the test object comprises a stack package including a plurality of laminated semiconductor packages, the stack package having a conductive ball corresponding to the bottom connection terminal and a bonding pad corresponding to the top connection terminal.

8. The socket of claim 7, further comprising a third contact board interposed between the semiconductor packages and including a third contact member, the third contact member being electrically connected to the conductive ball and the bonding pad.

9. The socket of claim 8, wherein the third contact board further includes a second conductive connection member configured to electrically connect the first conductive connection member to the second contact member.

10. The socket of claim 1, further comprising:
a socket body in which the first contact board is installed; and
a socket lid connected to the socket body, the socket lid being configured to rotate with respect to the socket body to press the second contact board in a direction of the test object.

11. A socket for an electrical tester comprising:
a first contact board arranged at a bottom side of a stack package and including a first contact member and a first conductive connection member, the stack package including a first semiconductor package and a second semiconductor package having a conductive ball and a bonding pad, the first contact member being electrically connected to the conductive ball of the first semiconductor package, the first conductive connection member being isolated from the stack package;
a second contact board arranged at a top side of the second semiconductor package and including a second contact member, the second contact member being electrically connected to the first conductive connection member and the bonding pad of the second semiconductor package;
a third contact board interposed between the first and second semiconductor packages and including a third contact member, the third contact member being electrically connected to the conductive ball of the second semiconductor package and the bonding pad of the first semiconductor package; and
a connection structure configured to connect the first through third contact boards to each other.

12. The socket of claim 11, wherein the second contact member comprises:
a connection pin formed on the second contact board and electrically connected to the first conductive connection member;
a conductive pattern extended from the connection pin; and
a contact pin formed on the second contact board, extended from the conductive pattern, and electrically connected to the bonding pad of the second semiconductor package.

13. The socket of claim 11, wherein the third contact board further includes a second conductive connection member electrically connecting the first conductive connection member to the second contact member.

14. The socket of claim 11, further comprising:
a socket body in which the first contact board is installed; and
a socket lid connected to the socket body, the socket lid being configured to rotate with respect to the socket body to press the second contact board in a direction of the stack package.

15. A socket for an electrical tester comprising:
a first contact board arranged at a bottom side of a test object and including a first contact member and a first conductive connection member, the first contact member being electrically connected to a bottom connection terminal formed on the bottom side of the test object, the first conductive connection member being isolated from the test object;
a second contact board arranged at a top side of the test object and including a second contact member, the second contact member being electrically connected to the first conductive connection member and a top connection terminal formed on a top side of the test object;
a socket body in which the first contact board is installed; and
a socket lid connected to the socket body, the socket lid being configured to rotate with respect to the socket body to press the second contact board in a direction of the test object,
wherein the test object includes a semiconductor package having a conductive ball corresponding to the bottom connection terminal and a bonding pad corresponding to the top connection terminal.

16. The socket of claim 15, wherein the second contact member comprises:
a connection pin formed on the second contact board and electrically connected to the first conductive connection member;
a conductive pattern extended from the connection pin; and
a contact pin formed on the second contact board, extended from the conductive pattern, and electrically connected to the top connection terminal.

17. The socket of claim 15, wherein the semiconductor package is a stack package including a plurality of laminated semiconductor packages, the stack package having a conductive ball corresponding to the bottom connection terminal and a bonding pad corresponding to the top connection terminal.

18. The socket of claim 17, further comprising a third contact board interposed between the semiconductor packages and including a third contact member, the third contact member being electrically connected to the conductive ball and the bonding pad.

* * * * *